(12) United States Patent
Marcault et al.

(10) Patent No.: US 10,930,572 B2
(45) Date of Patent: Feb. 23, 2021

(54) METHOD FOR MANUFACTURING A THREE DIMENSIONAL POWER MODULE

(71) Applicant: COMMISSARIAT A L'ENERGIE ATOMIQUE ET AUX ENERGIES ALTERNATIVES, Paris (FR)

(72) Inventors: Emmanuel Marcault, La Bazoche-Gouet (FR); Jean-Charles Cigna, Toulouse (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 192 days.

(21) Appl. No.: 16/322,766

(22) PCT Filed: Jul. 28, 2017

(86) PCT No.: PCT/FR2017/052141
§ 371 (c)(1),
(2) Date: Feb. 1, 2019

(87) PCT Pub. No.: WO2018/024973
PCT Pub. Date: Feb. 8, 2018

(65) Prior Publication Data
US 2020/0343150 A1 Oct. 29, 2020

(30) Foreign Application Priority Data
Aug. 5, 2016 (FR) ...................................... 1657602

(51) Int. Cl.
*H01L 23/051* (2006.01)
*H01L 23/367* (2006.01)
*H01L 23/00* (2006.01)

(52) U.S. Cl.
CPC ........ *H01L 23/051* (2013.01); *H01L 23/3675* (2013.01); *H01L 24/83* (2013.01)

(58) Field of Classification Search
CPC .... H01L 23/051; H01L 23/3675; H01L 24/83
See application file for complete search history.

(56) References Cited

U.S. PATENT DOCUMENTS

| 5,608,610 A | 3/1997 | Brzezinski |
| 6,476,476 B1 * | 11/2002 | Glenn .................... H05K 1/119 257/686 |
| 6,563,213 B1 | 5/2003 | Wong et al. |

(Continued)

OTHER PUBLICATIONS

International Search Report dated Dec. 1, 2017 in PCT/FR2017/052141 filed Jul. 28, 2017.

*Primary Examiner* — Peniel M Gumedzoe
(74) *Attorney, Agent, or Firm* — Oblon, McClelland, Maier & Neustadt, L.L.P.

(57) ABSTRACT

A method for encapsulating an integrated circuit includes: forming first and second electrically insulating supports each having a planar surface, so as to form a recess in the first support with respect to its planar surface, and so as to form, with respect to the planar surface of each of the first and second supports, first and second reliefs, so that the first and second reliefs of the supports interact; forming a first electrical contact in the recess; positioning a chip in the recess; forming a second electrical contact on the second carrier; and superposing the first and second carriers so as to superpose their reliefs.

15 Claims, 6 Drawing Sheets

(56) References Cited

U.S. PATENT DOCUMENTS

| | | | |
|---|---|---|---|
| 6,724,206 B2* | 4/2004 | Arakawa | G01R 1/0483 |
| | | | 324/750.19 |
| 6,906,407 B2* | 6/2005 | Byers | H01L 25/0657 |
| | | | 257/685 |
| 2001/0002729 A1 | 6/2001 | Wong et al. | |
| 2013/0094165 A1* | 4/2013 | Yano | H01L 23/13 |
| | | | 361/784 |
| 2014/0117473 A1 | 5/2014 | Kierse et al. | |
| 2014/0307390 A1 | 10/2014 | Baker et al. | |
| 2015/0357258 A1 | 12/2015 | Fitzgerald et al. | |
| 2016/0064302 A1 | 3/2016 | Yamada | |
| 2016/0105737 A1 | 4/2016 | Kierse et al. | |
| 2017/0257687 A1 | 9/2017 | Kierse et al. | |

\* cited by examiner

METHOD FOR MANUFACTURING A THREE DIMENSIONAL POWER MODULE

BACKGROUND

The invention relates to three-dimensional power modules, and in particular the methods for manufacturing such power modules.

A power module is an element whose operation is likened to that of one or more switches. Its structure is generally composed of an association of different elements:

- chips including a semiconductor component ensuring the electrical switching function;
- an insulating substrate allowing both the electrical insulation and the transfer of the heat flux given off by the chips;
- a sole plate for a link to a heat sink;
- an encapsulation;
- a package;
- internal and external electrical connections;
- sometimes decoupling capacitors.

The increasing of the operating temperatures is one of the current trends in power electronics. The chips with silicon components are limited by a maximum junction temperature generally lying between 125 and 200° C., which slows down the development of the high-temperature applications. Furthermore, the breakdown voltage of a silicon component is limited and its switching losses at high frequency are high. This type of application involves fields that are as varied as civil and military aeronautics, rail tractions, motor vehicles, energy distribution, onshore and offshore oil drilling, geothermal research, or space.

For high-voltage and/or high-frequency applications, chips with heterojunction transistors, and including in particular high electron mobility transistors with Group III nitride, are used increasingly.

One of the major issues in power electronics for the rise in temperature, in voltage or in frequency of the power modules is the availability of reliable techniques for encapsulation of different chips and components, ensuring both the electrical interconnection of the semiconductor components, the discharging of the heat generated by these components and, sometimes, the mechanical strength of the module.

In addition to the semiconductor of the components, limitations in terms of electrical performance levels, in terms of temperature rise and in terms of reliability of the power components and modules, stem from the materials and their encapsulation. One of the major limitations is the creation of thermomechanical stresses associated with the difference in expansion coefficient of the materials upon a variation of temperature.

New encapsulation concepts propose producing a three-dimensional structure, in particular in order to cool the encapsulated module by two faces and in order to reduce the surface footprint of the module.

The thesis by M. Bassem Mouawad, published under the title "assemblages innovants en électronique de puissance utilisant la technique de "Spark Plasma Sintering"" ["innovative assemblies in power electronics using the "Spark Plasma Sintering" technique"], describes an example of a module encapsulation method. In this example, two ceramic-based substrates with directly bonded copper are provided. Each ceramic-based substrate comprises a face provided with a layer of copper formed according to a two-dimensional pattern and according to a pattern in its thickness. The patterns in the thickness define in particular three bumps. A first bump is intended to be fixed onto a chip, the second and third bumps are intended to be fixed to bumps of the layer of copper of the other ceramic-based substrate, positioned opposite. By brazing, the first bump of each copper layer is fixed to a respective face of the chip, and the second bumps and the third bumps of these facing layers of copper are mutually fixed. The association of the second and third bumps of the two substrates forms a structure that makes it possible to absorb the compression loads applied transversely to the substrates.

Defining a pattern in the thickness of the layer of copper proves to be complex and costly. Moreover, relative positioning between the substrates, and between the module and the substrates proves to be tricky with an adequate level of accuracy.

BRIEF SUMMARY

The invention aims to resolve one or more of these drawbacks. The invention thus relates to a method for encapsulating an integrated circuit, as defined in the attached claim 1.

The invention relates also to the variants defined in the dependent claims. The person skilled in the art will understand that each of the features of the variants of the dependent claims can be combined independently with the features of the independent claim, without in any way constituting an intermediate generalization.

BRIEF DESCRIPTION OF THE DRAWINGS

Other features and advantages of the invention will emerge clearly from the description which is given hereinbelow, in an indicative and nonlimiting manner, with reference to the attached drawings, in which.

DETAILED DESCRIPTION

Figure 1:
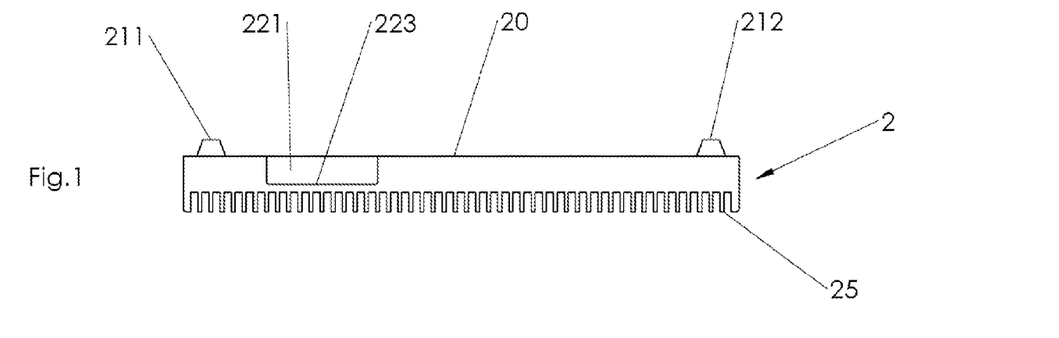
FIGS. 1 to 4 are views in transverse cross section of an integrated circuit support at different steps of an exemplary manufacturing method.

FIG. 1 is a view in transverse cross section of a first support 2 of an integrated circuit 1, during a step of the method for manufacturing same. For example, by three-dimensional printing or by powder injection molding of a dielectric material, the support 2 is formed. The support 2, thus formed (for example and in a nonlimiting manner by three-dimensional printing or by powder injection molding), has a planar surface 20 on its top face. A recess 221 is formed set back with respect to the planar surface 20. Another recess 222 (illustrated later) is also formed set back with respect to the planar surface 20. First and second reliefs 211 and 212 are formed with respect to the planar surface 20. The reliefs 211 and 212 are positioned at different points of the support 2. The reliefs 211 and 212 are, here, bumps formed protruding from the planar surface 20. The support 2 is formed in a single piece during the three-dimensional printing or during the powder injection molding. During the three-dimensional printing or during the powder injection molding, cooling fins 25 are advantageously formed on the bottom face of the support 2.

The first and second reliefs 211 and 212 can be formed in a ceramic selected (not exclusively) from the group composed of:
  aluminum nitride
  boron nitride
  silicon nitride
  alumina (or aluminum oxide).

The forming will be able to be implemented by three-dimensional printing or by powder injection molding of such a ceramic.

It will be noted that these ceramics can be more or less filled in order to modify their physical properties.

Figure 2:
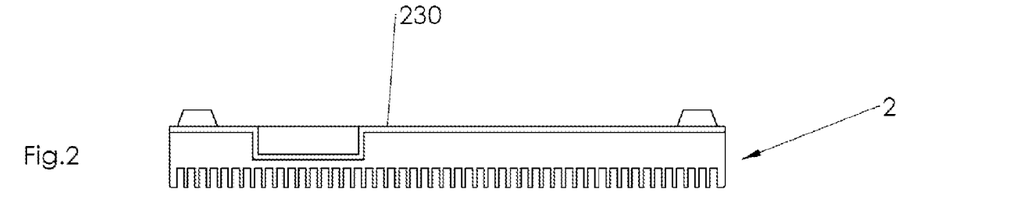

In FIG. 2, the top face of the support 2 is metallized, in order to metallize at least the bottom 223 of the recess 221 and the bottom of the recess 222 with a layer of metal 230. The metallization of this top layer is for example done as a solid sheet, such that the layer of metal 230 here covers the reliefs 211 and 212, as well as the planar surface 20. A solid sheet metallization can for example be produced by PVD. The thin-layer deposits (PVD) applied to the ceramic can be for example:
  Ti/Pt/Au
  Cr/Ni/Au
  NiCr/Au
  Silver, copper, or AuSn.

A metallization can also be produced for example by direct bonding of copper, for example in a solid sheet. Other recesses and other reliefs can also be formed in the three-dimensional printing or in the powder injection molding of the support 2 but will not be detailed further.

Figure 3:
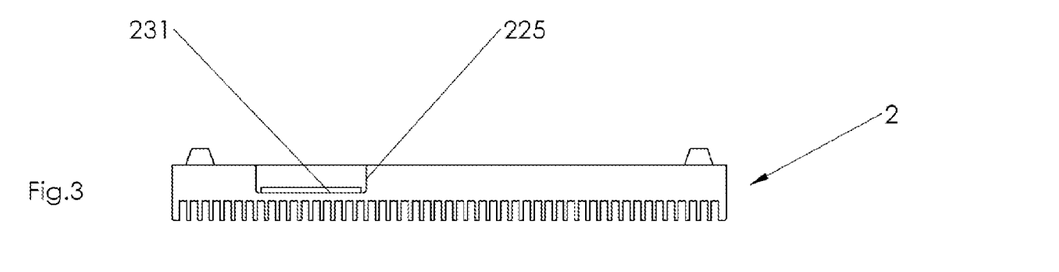

In FIG. 3, a forming of the layer of metal 230 is carried out, to delimit a metal contact 231 on the bottom 223 of the recess 221. The forming of the layer of metal 230 can also serve to define conductive tracks on the planar surface 20, for example to create electrical connections. The forming of the layer of metal 230 can for example be implemented by photolithography and etching steps, in a manner known per se. The forming of the layer of metal 230 aims in particular to remove most of the layer 230 from the planar surface 20, and from the reliefs 211 and 212. The layer 230 is removed from the lateral walls 225 of the recess 221 but a part of the layer 230 can be retained on a lateral wall 225 of the recess 221 to form a connection with the metal contact 231. Similarly, the forming of the layer of metal 230 can delimit the metal contact 232 from the bottom of the recess 222.

Figure 4:
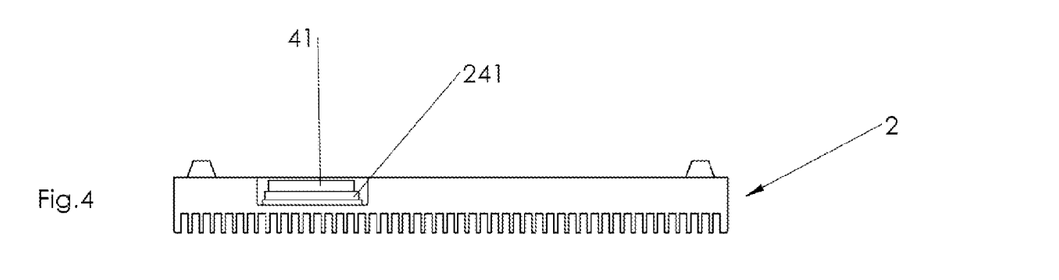

In FIG. 4, a brazing paste 241 has been deposited on the metal contact 231. Additionally, a brazing paste 242 has been deposited (illustrated in FIG. 5) on the metal contact 232.

Figure 5:
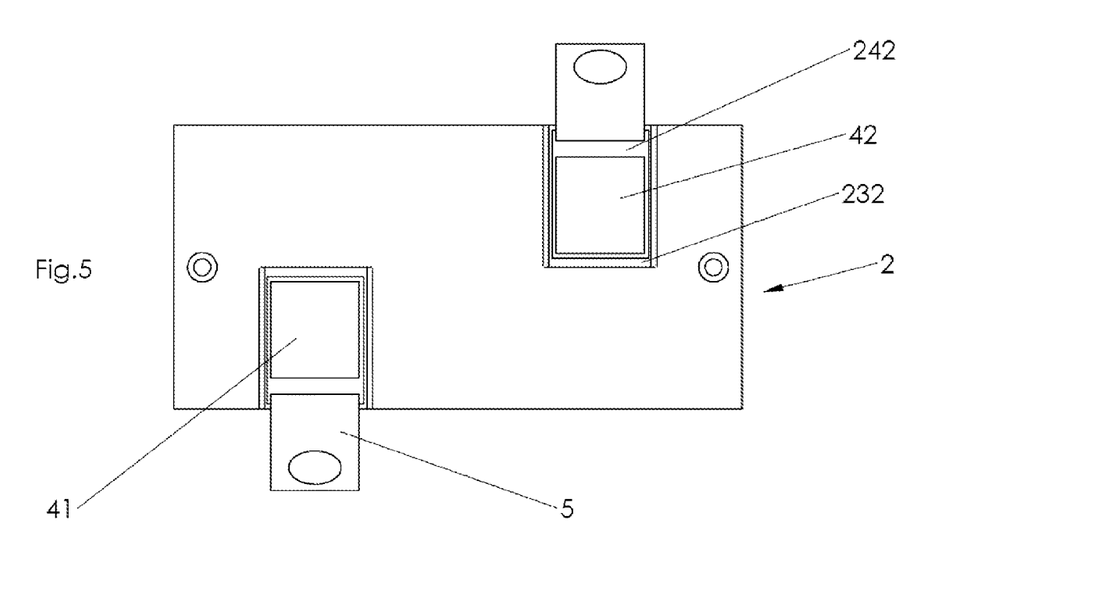
FIG. 5 is a plan view of the integrated circuit support at another step of an exemplary manufacturing method.
Figure 6:
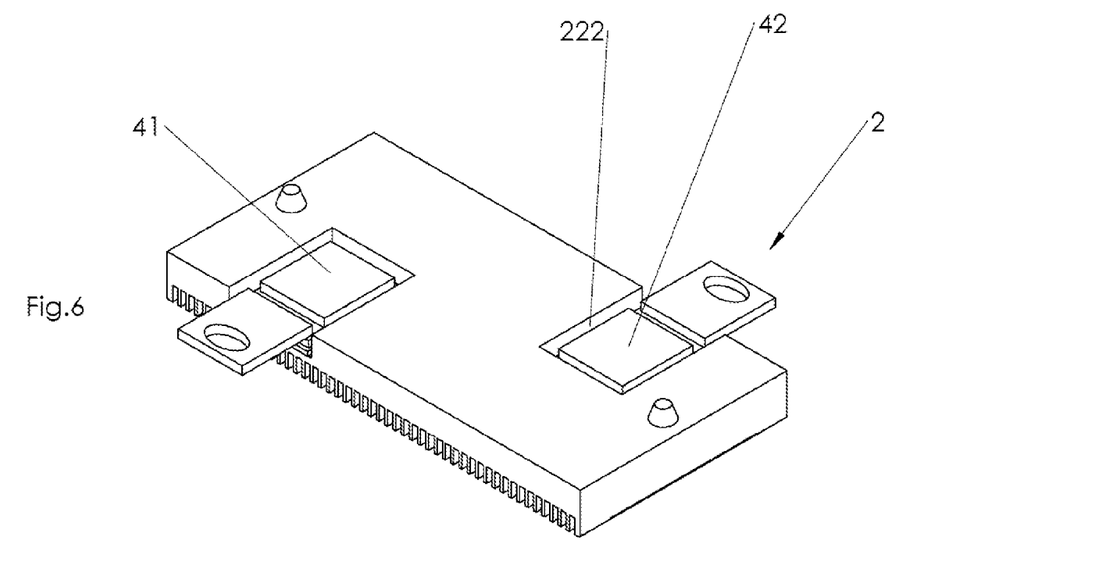
FIG. 6 is a perspective view of the integrated circuit support of FIG. 4.

As illustrated in FIGS. 5 and 6, a chip 41 has then been positioned in contact with the brazing paste 241 at the bottom of the recess 221. An electrode of the chip 41 is for example placed in contact with the brazing paste 241, for example a biasing electrode of a substrate of the chip 41. An electrical connection is thus formed between an electrode of the chip 41 and the contact 231. Moreover, a power connector 5 has advantageously been positioned against the brazing paste 241, on the side of the chip 41, and overhanging with respect to a lateral edge of the support 2. Through a brazing step, the chip 41 has been fixed to the contact 231, via the brazing paste 241. Through a brazing step, the power connector 5 has also been fixed to the contact 231, via the brazing paste 241. Additionally, a chip 42 has here been positioned in contact with a brazing paste 242 in the bottom of the other recess 222. An electrode of the chip 42 is for example placed in contact with the brazing paste 242, for example a biasing electrode of a substrate of the chip 42. Through a brazing step, the chip 42 has been fixed to the contact 232, via the brazing paste 242.

For example by three-dimensional printing or by powder injection molding of a dielectric material, another support 3 of an integrated circuit 1 is formed. The support 3 can then have the geometry illustrated in FIGS. 7 and 8. The support 3 that is thus formed (for example and in a nonlimiting manner by three-dimensional printing or by powder injection molding) has a planar surface on its bottom face. A recess 321 is formed set back with respect to the planar surface 30. Another recess 322 is formed set back with respect to the planar surface 30. First and second reliefs 311 and 312 are formed with respect to the planar surface 30. The reliefs 311 and 312 are positioned at different points of the support 3. The reliefs 311 and 312 are, here, bores set back with respect to the planar surface 30. The reliefs 311 and 312 have, for example, a form complementing that of the reliefs 211 and 212, or are configured to be able to house most of the reliefs 211 and 212. The support 3 is formed in a single piece in the three-dimensional printing or in the powder injection molding. During the three-dimensional printing or during the powder injection molding, cooling fins 35 are advantageously formed on the top face of the support 3.

The three-dimensional printing or the powder injection molding can be carried out as appropriate by printing or injection molding of a powder of a ceramic selected from the group composed of $Al_2O_3$, AlN, BeOx, or any other material exhibiting electrical insulation properties and ideally good thermal conducting properties.

Figures 7, 8:
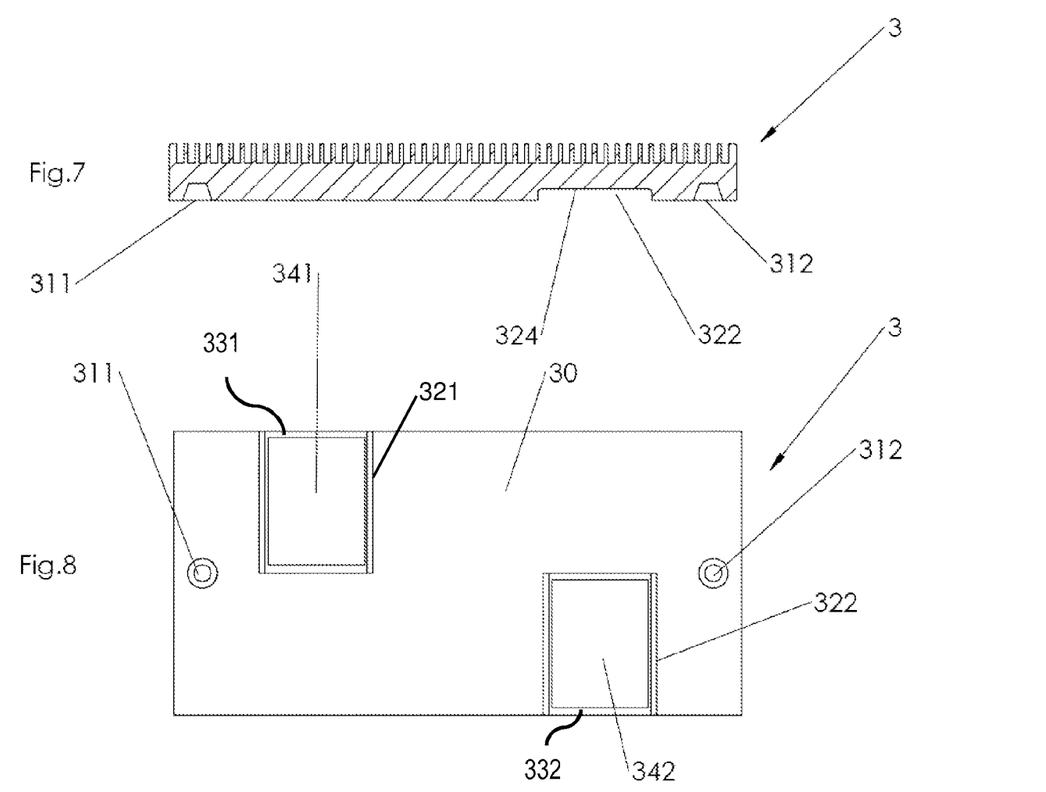
FIG. 7 is a view in transverse cross section of another integrated circuit support at a step of an exemplary manufacturing method.
FIG. 8 is a view from below of the support of FIG. 7.

The bottom face of the support 3 has been metallized, so as to metallize at least the bottom of the recess 321 with a layer of metal. The metallization of this bottom layer is for example done as a solid sheet, such that the layer of metal initially covers the reliefs 311 and 312, as well as the planar surface 20. The solid sheet metallization can for example be performed by PVD on a ceramic material formed in the three-dimensional printing or in the powder injection molding. The thin layer deposits (PVD) applied to the ceramic can be for example:
  Ti/Pt/Au
  Cr/Ni/Au
  NiCr/Au
  Silver, copper, or AuSn.

Other recesses and other reliefs can also be formed in the three-dimensional printing or in the powder injection molding of the support 3 but will not be detailed further.

A forming of the layer of metal has been carried out, to delimit a metal contact 331 on the bottom of the recess 321, and to delimit a metal contact 332 on the bottom 324 of the recess 322. The forming of the layer of metal can also serve to define conductive tracks on the planar surface 30, for example to create electrical connections. The forming of the layer of metal can for example be implemented by photolithography and etching steps, in a manner known per se. The forming of the layer of metal of the support 3 aims in particular to remove most of this layer from the planar surface 30, and from the reliefs 311 and 312. The layer of metal is removed from the lateral walls of the recess 321 and of the recess 322, but a part of the layer of metal can be retained on a lateral wall/inclined plane of the recess 321 and/or of the recess 322, to form a connection with the metal contact 331 or with the metal contact 332 as appropriate.

Figure 9:
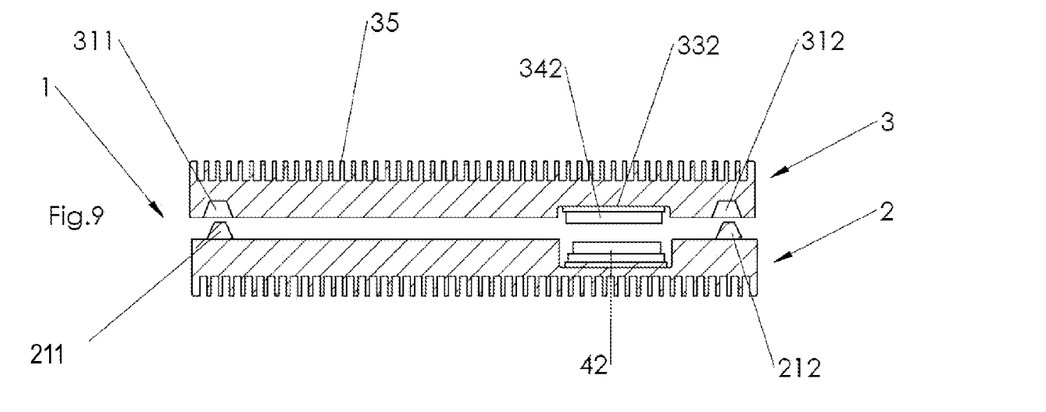
FIGS. 9 and 10 are views in transverse cross section of an integrated circuit at different steps of an exemplary encapsulation method according to the invention.

In a step of the encapsulation method illustrated in FIG. 9, the supports 2 and 3 are positioned facing one another, such that the bottom surface of the support 3 faces the top surface of the support 2. The planar surfaces 20 and 30 are positioned parallel to one another. The reliefs 311 and 312 are positioned facing the reliefs 211 and 212 respectively. The recesses 221 and 222 are positioned facing the recesses 321 and 322 respectively. The brazing paste 341 is then positioned plumb with a top electrode of the chip 41. The brazing paste 342 is then positioned plumb with a top electrode of the chip 42.

Figure 10:
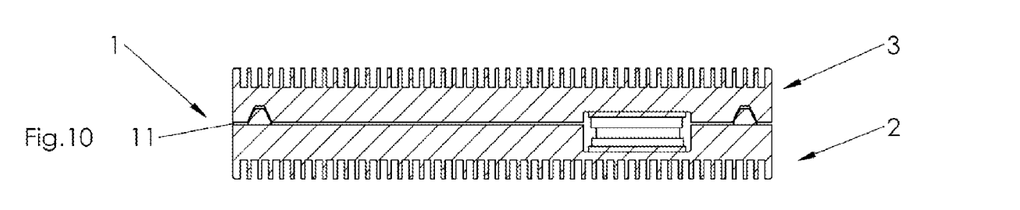

During the step of the encapsulation method illustrated in FIG. 10, the support 2 and the support 3 are slid relative to one another in a transverse direction, that is to say a direction at right angles to their planar surfaces 20 and 30, so as to bring them closer together. The reliefs 211 and 212 of the support 2 then cooperate with the reliefs 311 and 312 of the support 3 to slidingly guide them with respect to one another in the transverse direction.

The relative sliding between the supports 2 and 3 is continued until the brazing paste 341 is brought into contact with the chip 41 and until the brazing paste 342 is brought into contact with the chip 42. During this sliding, the cooperation between the reliefs 211, 212 and 311, 312 makes it possible to guarantee the relative positioning between the brazing pastes 341 and 342 on the one hand, and the chips 41 and 42 on the other hand, by preventing a relative pivoting of the supports 2 and 3 relative to a direction normal to the planar surfaces 20 and 30, and by preventing a relative sliding of the supports 2 and 3 in a direction parallel to the planar surfaces 20 and 30.

The integrated circuit 1 obtained at this stage is advantageously designed for a space 11 to be formed between the supports 2 and 3 when the brazing paste 341 makes the contact with the chip 41 and when the brazing paste 342 makes the contact with the chip 42. The risks of excessive creep of the brazing pastes 341 and 342 in the subsequent steps are thus limited, and a subsequent injection of a resin or of a dielectric material between the supports 2 and 3 and around the chips 41 and 42 is made possible.

Once the brazing pastes 341 and 342 are in contact respectively with the respective top electrodes of the chips 41 and 42, the brazing of the brazing pastes 341 and 342 with these chips 41 and 42 is carried out. A fixing of the chips 41 and 42 to the support 3 is thus formed, as is an electrical connection between the top electrodes of the chips 41 and 42 with the electrical contacts 331 and 332 respectively.

Figure 11:
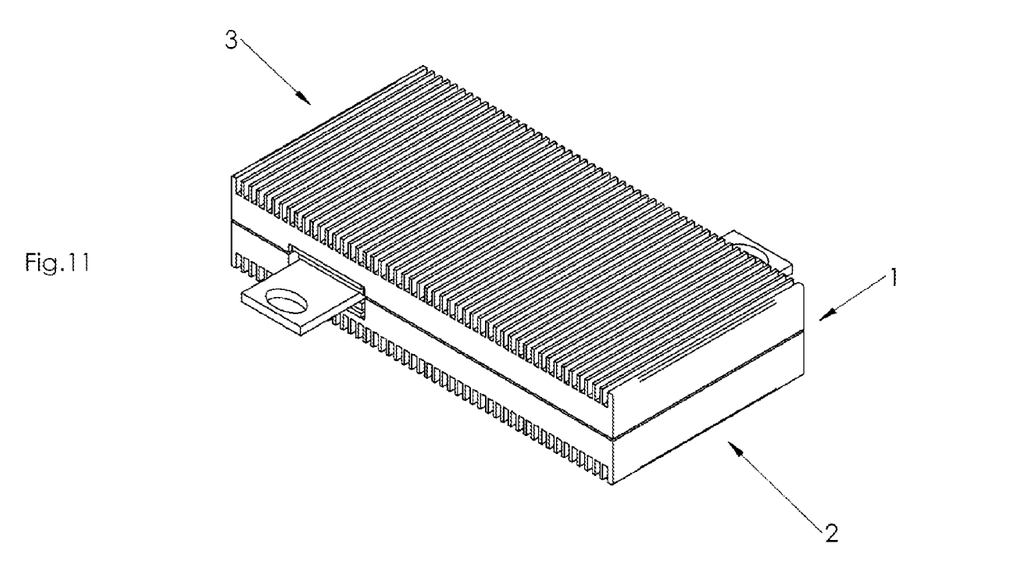
FIG. 11 is a perspective view of the integrated circuit at the end of the encapsulation method.

FIG. 11 illustrates a perspective view of the integrated circuit 1 at the end of the brazing step. The encapsulation method can be continued with the injection of an encapsulation material between the supports 2 and 3, for example via the space 11. The encapsulation material that is injected is a dielectric material, typically an epoxy resin or an encapsulation foam.

The integrated circuit 1 obtained at the end of the encapsulation method exhibits enhanced cooling, the outer faces of the supports 2 and 3 contributing to the cooling. This cooling is further enhanced in the example illustrated, by virtue of the presence of the respective cooling fins 25 and 35 on the outer faces of the supports 2 and 3 respectively.

Moreover, such an integrated circuit 1 obtained in this way can have a smaller footprint in the plane of the planar surfaces 20 and 30, conductive tracks being able in particular to be distributed between the supports 2 and 3.

In the example illustrated, the recesses of the supports 2 and 3 have lateral walls (for example the lateral wall 225) that are substantially vertical. It is also possible to envisage one or more of the lateral walls of the recesses being inclined with respect to the normal to the planar surfaces 20 or 30. In particular, the lateral walls intended to receive a metal deposit extending from one of the planar surfaces 20 or 30 up to a bottom wall of the recess will advantageously have such an inclination to facilitate the securing of the metallization and the insertion of a chip in the recess.

Figure 12:
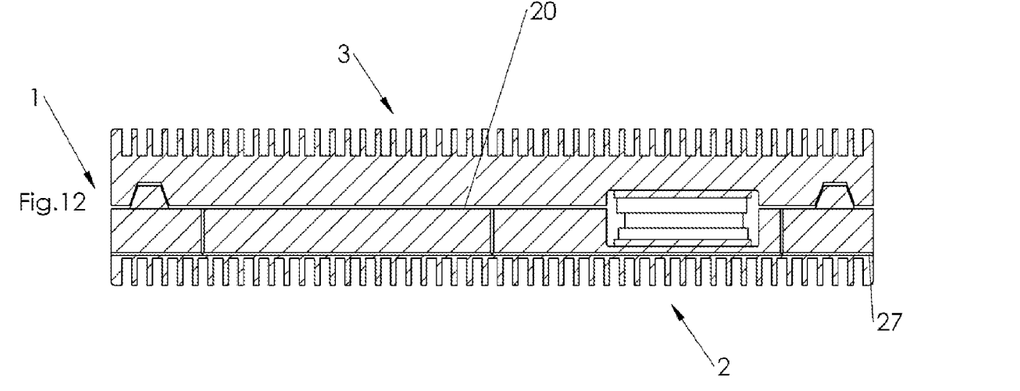
FIG. 12 is a view in transverse cross section of a variant integrated circuit at a step of another exemplary encapsulation method according to the invention.

FIG. 12 is a view in transverse cross section of a variant of the integrated circuit 1. This variant integrated circuit 1 differs from that illustrated in FIG. 10 only through the structure of its support 2. The support 2 here comprises a channel 27 emerging at the planar surface 20. The channel 27 also communicates with an input, formed here on a lateral edge of the support 2. The channel 27 can be used on completion of the configuration obtained in FIG. 10. The channel 27 can then be used to inject the encapsulation material into the space 11.

FIGS. 13 to 16 illustrate, by way of example, different variants of male reliefs, that can be formed on one of the supports 2 or 3, in order to favor the guiding thereof with respect to the other support. In the examples of FIGS. 13 to 16, the reliefs illustrated are male reliefs formed on the support 2. The male relief or reliefs can also be formed on the support 3 and cooperate with female reliefs of the support 2.

The male reliefs of FIGS. 13 to 16 advantageously have a section that decreases with distance away from their planar surface 20, such that they are easily inserted into the female reliefs of the support 3, before favoring the sliding guiding and the centering with respect to these female reliefs, when the sliding is continued.

Figure 13:
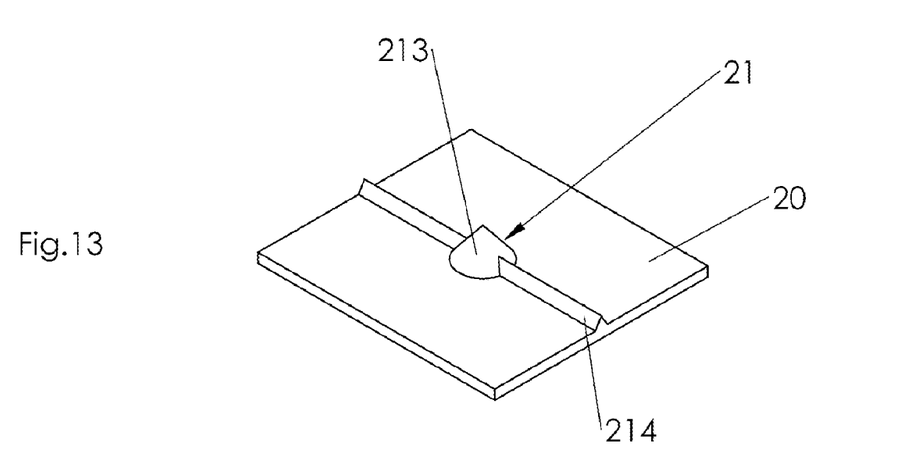
FIGS. 13 to 16 are perspective views of different examples of forms of male reliefs with a view to positioning the supports relative to one another.

In FIG. 13, the relief 21 comprises a cone 213 and a bulge of triangular section 214. The bulge 214 here passes through the cone 213 and has a lesser height with respect to the cone 213. The cone 213 can have another function of centering with respect to a female relief, the bulge 214 being able to have a locking function countering relative pivotings of the supports 2 and 3 about a line normal to the planar surface 20. It is also possible to provide for the bulge 214 not to penetrate into a female relief of the support 3. The bulge 214 can then serve as abutment for the planar surface 30, and thus keep a gauged value for the space 11, by virtue of its lesser height with respect to the cone 213.

Figure 14:
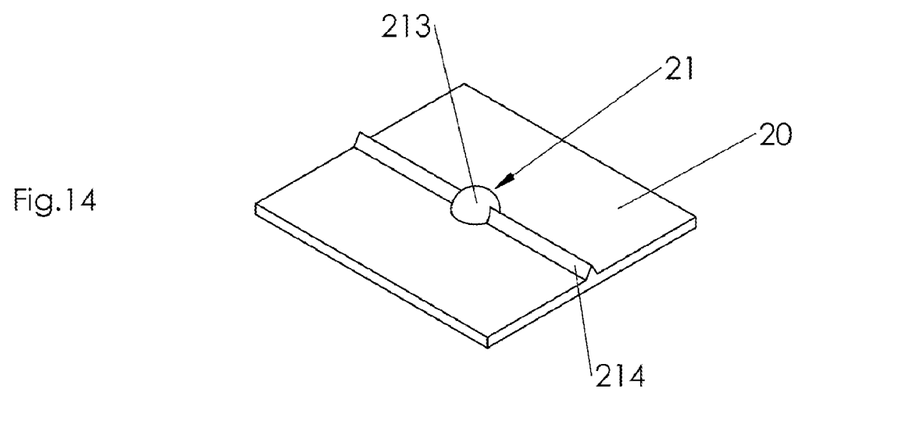

In FIG. 14, the relief 21 comprises a hemispherical form 213 and a bulge of triangular section 214. The bulge 214 here passes through the hemisphere 213 and has a lesser height with respect to this hemisphere 213. The hemisphere 213 can also have a function of centering with respect to a female relief, the bulge 214 being able to have a locking function countering relative pivotings of the supports 2 and 3 about a line normal to the planar surface 20. It is also possible to provide for the bulge 214 not to penetrate into a female relief of the support 3. The bulge 214 can then serve as abutment for the planar surface 30, and thus keep a gauged value for the space 11, by virtue of its lesser height with respect to the hemisphere 214.

Figure 15:
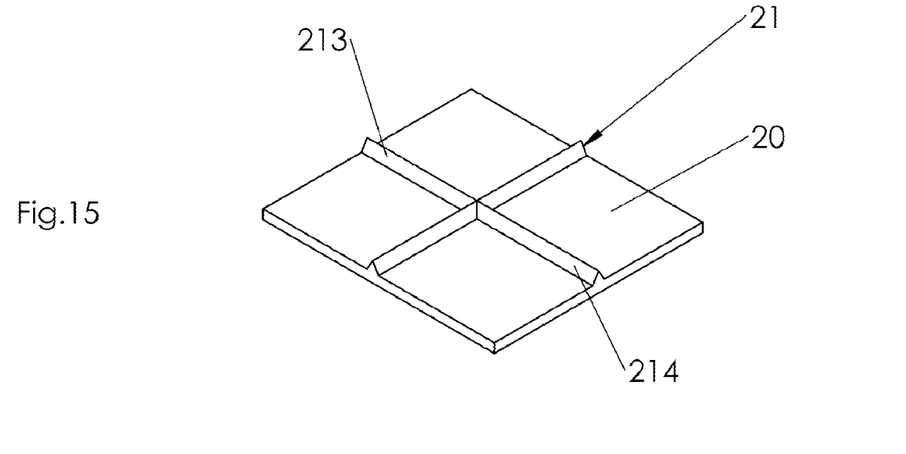

In FIG. 15, the relief 21 comprises bulges 213 and 214 of triangular section and oriented in right-angled directions. The bulges can cooperate with female reliefs of the support 3 to lock a relative pivoting of the supports 2 and 3 about a line normal to the planar surface 20.

Figure 16:
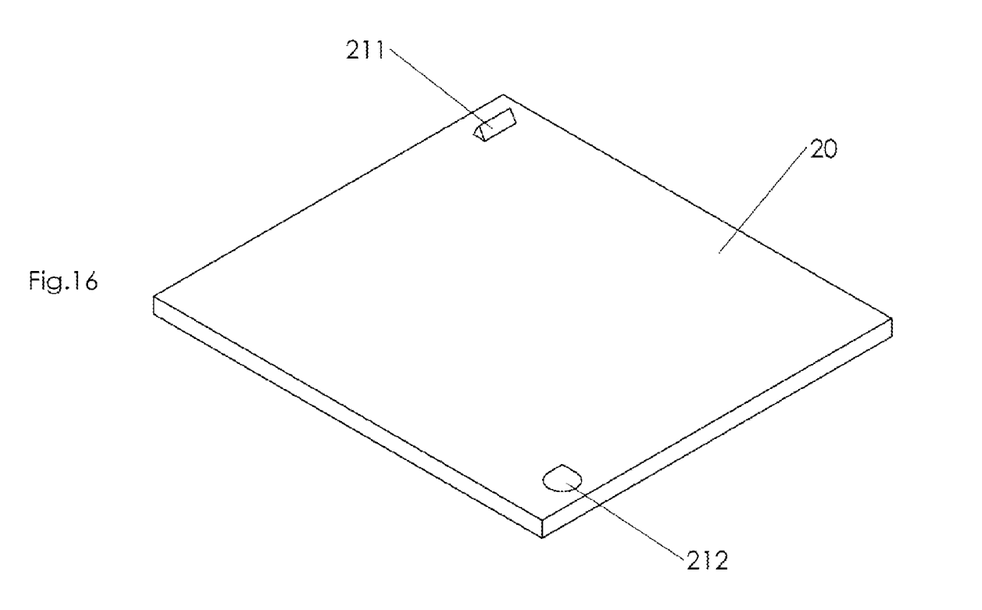

In FIG. 16, two reliefs 211 and 212 of different forms have been formed on the planar surface 20, with, respectively, a bulge form of triangular section, and a cone form.

The invention applies advantageously to an integrated circuit 1, in which at least one of the chips fixed includes a power component or a component exhibiting a high breakdown voltage (typically several hundreds of volts). The integrated circuit 1 comprises, for example, a chip 41 including a heterojunction transistor.

The brazing paste illustrated in the preceding examples takes the form of a layer. It is also possible to envisage depositing the brazing paste in the form of dissociated bumps, so as to reduce the risks of creep of this brazing paste beyond the recesses in which it is initially positioned.

According to a variant, one of the supports can be produced by the initial three-dimensional printing or powder injection molding of a conductive material, followed by a deposition of an insulating material to cover this conductive material. The insulation on the planar faces of the supports can be formed by a deposition of insulating material other than by three-dimensional printing or by powder injection molding.

The invention claimed is:

1. A method for encapsulating an integrated circuit, comprising:
   forming first and second electrically insulating supports, the first and second supports formed each having a planar surface, so as to form a recess in the first support with respect to its planar surface, and so as to form, with respect to the planar surface of each of the first and second supports, first and second reliefs, such that the first and second reliefs of the first support cooperate with the first and second reliefs of the second support to guide the first support by sliding with respect to the second support in a direction transversal to said planar surfaces;
   forming a first electrical contact in said recess;
   positioning a chip in said recess and forming an electrical contact between a first electrode of the chip and said first electrical contact;
   forming a second electrical contact on said second support and depositing a brazing material on said second electrical contact;
   superposing the first and second supports so as to superpose the first and second respective reliefs and so as to position the brazing material plumb with a second electrode of said chip;
   sliding the first support in said transverse direction with respect to the second support to bring the brazing material into contact with the second electrode of the chip; and
   brazing the brazing material so as to fix said chip to said second support.

2. The encapsulation method as claimed in claim 1, wherein a gap is formed between the respective planar surfaces of the first and second supports.

3. The encapsulation method as claimed in claim 2, further comprising injecting an electrically insulating resin into said gap.

4. The encapsulation method as claimed in claim 1, wherein the forming the first and second electrically insulating supports includes a three-dimensional printing or a powder injection molding.

5. The encapsulation method as claimed in claim 4, wherein the forming the first and second electrically insulating supports includes forming a channel inside the first or the second support, the channel emerging on said planar surface of the first or the second support, and said injecting the insulating resin includes injecting said insulating resin via said channel.

6. The encapsulation method as claimed in claim 1, wherein said forming the first and second electrically insulating supports includes forming a ceramic selected from the group composed of $Al_2O_3$, AlN or BeOx.

7. The encapsulation method as claimed in claim 6, wherein the forming said first and second electrical contacts is performed by direct bonding of copper on said ceramic.

8. The encapsulation method as claimed in claim 6, wherein the forming said first and second electrical contacts is performed by physical vapor deposition.

9. The encapsulation method as claimed in claim 1, wherein said forming the first and second electrically insulating supports includes forming cooling fins in said first and second supports.

10. The encapsulation method as claimed in claim 9, wherein said cooling fins are formed on faces of said first and second supports opposite said planar surfaces.

11. The encapsulation method as claimed in claim 1, wherein said chip includes a heterojunction transistor.

12. The encapsulation method as claimed in claim 1, wherein said first reliefs of the first and second supports have a form that narrows with distance away from said planar surface.

13. The encapsulation method as claimed in claim 12, wherein said first reliefs formed have a tapered lateral face.

14. The encapsulation method as claimed in claim 12, wherein said first reliefs formed have a hemispherical surface.

15. The encapsulation method as claimed in claim 12, wherein one of said reliefs formed has a form without symmetry with respect to an axis normal to its planar surface.

* * * * *

UNITED STATES PATENT AND TRADEMARK OFFICE
CERTIFICATE OF CORRECTION

| | | |
|---|---|---|
| PATENT NO. | : 10,930,572 B2 | Page 1 of 1 |
| APPLICATION NO. | : 16/322766 | |
| DATED | : February 23, 2021 | |
| INVENTOR(S) | : Marcault et al. | |

It is certified that error appears in the above-identified patent and that said Letters Patent is hereby corrected as shown below:

On the Title Page

Item (54), and in the Specification Column 1 Lines 1-2, delete "THREE DIMENSIONAL" and insert -- THREE-DIMENSIONAL --, therefor.

Signed and Sealed this
Twenty-fourth Day of August, 2021

Drew Hirshfeld
*Performing the Functions and Duties of the
Under Secretary of Commerce for Intellectual Property and
Director of the United States Patent and Trademark Office*